(12) United States Patent
Bucksch

(10) Patent No.: US 7,415,649 B2
(45) Date of Patent: Aug. 19, 2008

(54) SEMI-CONDUCTOR COMPONENT TEST DEVICE WITH SHIFT REGISTER, AND SEMI-CONDUCTOR COMPONENT TEST PROCEDURE

(75) Inventor: Thorsten Bucksch, München (DE)

(73) Assignee: Infineon Technologies AG, Munich (DE)

( * ) Notice: Subject to any disclaimer, the term of this patent is extended or adjusted under 35 U.S.C. 154(b) by 211 days.

(21) Appl. No.: 11/253,813

(22) Filed: Oct. 20, 2005

(65) Prior Publication Data

US 2006/0253756 A1 Nov. 9, 2006

(30) Foreign Application Priority Data

Oct. 21, 2004 (DE) .................. 10 2004 051 344

(51) Int. Cl.
*G01R 31/28* (2006.01)
(52) U.S. Cl. .................. 714/739; 714/30; 714/702; 714/718; 714/720; 714/728; 714/733; 714/734; 714/738; 714/742; 714/743; 711/100; 711/200; 365/201
(58) Field of Classification Search .................. None
See application file for complete search history.

(56) References Cited

U.S. PATENT DOCUMENTS

| | | | | | |
|---|---|---|---|---|---|
| 4,782,487 | A | * | 11/1988 | Smelser .................. | 714/723 |
| 5,033,048 | A | * | 7/1991 | Pierce et al. .................. | 714/719 |
| 5,101,409 | A | * | 3/1992 | Hack .................. | 714/720 |
| 5,138,619 | A | * | 8/1992 | Fasang et al. .................. | 714/718 |
| 5,258,986 | A | * | 11/1993 | Zerbe .................. | 714/719 |
| 5,617,531 | A | * | 4/1997 | Crouch et al. .................. | 714/30 |
| 5,668,819 | A | * | 9/1997 | Fukushima .................. | 714/736 |
| 5,938,784 | A | * | 8/1999 | Kim .................. | 714/733 |
| 6,006,345 | A | * | 12/1999 | Berry, Jr. .................. | 714/718 |
| 6,137,734 | A | * | 10/2000 | Schoner et al. .................. | 365/194 |
| 6,668,347 | B1 | * | 12/2003 | Babella et al. .................. | 714/733 |
| 6,694,461 | B1 | * | 2/2004 | Treuer .................. | 714/719 |

(Continued)

FOREIGN PATENT DOCUMENTS

DE 68923531 T2 4/1996

(Continued)

OTHER PUBLICATIONS

Wade, J. G. (1987). Chapter 6, pp. 152-156, In *Signal Coding and Processing: An Introduction Based on Video Systems*. Ellis Horwood Limited, Chichester, West Sussex, England.

*Primary Examiner*—Jacques Louis-Jacques
*Assistant Examiner*—John P Trimmings
(74) *Attorney, Agent, or Firm*—Slater & Matsil, L.L.P.

(57) ABSTRACT

The invention relates to a semi-conductor component test procedure, as well as to a semi-conductor component test device with a shift register, which comprises several memory devices from which pseudo-random values (BLA, COL, ROW) to be used for testing a semi-conductor component are able to be tapped and emitted at corresponding outputs of the semi-conductor component test device, whereby the shift register comprises at least one further memory device, from which a further pseudo-random value (VAR) is able to be tapped and whereby a device is provided, with which the further pseudo-random value (VAR) can selectively, if needed, be emitted at at least one corresponding further output of the semi-conductor component test device.

16 Claims, 5 Drawing Sheets

U.S. PATENT DOCUMENTS

| | | | |
|---|---|---|---|
| 6,769,084 B2 * | 7/2004 | Kim et al. | 714/739 |
| 6,964,000 B2 * | 11/2005 | Maeno | 714/720 |
| 6,966,017 B2 * | 11/2005 | Evans | 714/718 |
| 7,072,923 B2 * | 7/2006 | Duncan | 708/250 |
| 2002/0138800 A1 * | 9/2002 | Kim et al. | 714/719 |
| 2002/0194557 A1 * | 12/2002 | Park | 714/718 |
| 2004/0030970 A1 * | 2/2004 | Chen et al. | 714/718 |
| 2006/0085710 A1 * | 4/2006 | Spica et al. | 714/728 |

FOREIGN PATENT DOCUMENTS

| | | |
|---|---|---|
| DE | 19821004 C2 | 12/1999 |
| DE | 19910344 A1 | 9/2000 |
| EP | 1241678 A2 | 9/2002 |

* cited by examiner

FIG 4

| NUMBANK | NUMROW | NUMCOL | Row[15:13] | COL[15:13] | Bank[2] |
|---|---|---|---|---|---|
| 0 | 00 | 00 | | | |
| 0 | 00 | 01 | | LFSR[26] | |
| 0 | 00 | 10 | | LFSR[27:26] | |
| 0 | 00 | 11 | | LFSR[28:26] | |
| 0 | 01 | 00 | LFSR[26] | | |
| 0 | 01 | 01 | LFSR[27] | LFSR[26] | |
| 0 | 01 | 10 | LFSR[28] | LFSR[27:26] | |
| 0 | 01 | 11 | LFSR[29] | LFSR[28:26] | |
| 0 | 10 | 00 | LFSR[27:26] | | |
| 0 | 10 | 01 | LFSR[28:27] | LFSR[26] | |
| 0 | 10 | 10 | LFSR[29:28] | LFSR[27:26] | |
| 0 | 10 | 11 | LFSR[30:29] | LFSR[28:26] | |
| 0 | 11 | 00 | LFSR[28:26] | | |
| 0 | 11 | 01 | LFSR[29:27] | LFSR[26] | |
| 0 | 11 | 10 | LFSR[30:28] | LFSR[27:26] | |
| 0 | 11 | 11 | LFSR[31:29] | LFSR[28:26] | |
| 1 | 00 | 00 | | | LFSR[26] |
| 1 | 00 | 01 | | LFSR[26] | LFSR[27] |
| 1 | 00 | 10 | | LFSR[27:26] | LFSR[28] |
| 1 | 00 | 11 | | LFSR[28:26] | LFSR[29] |
| 1 | 01 | 00 | LFSR[26] | | LFSR[27] |
| 1 | 01 | 01 | LFSR[27] | LFSR[26] | LFSR[28] |
| 1 | 01 | 10 | LFSR[28] | LFSR[27:26] | LFSR[29] |
| 1 | 01 | 11 | LFSR[29] | LFSR[28:26] | LFSR[30] |
| 1 | 10 | 00 | LFSR[27:26] | | LFSR[28] |
| 1 | 10 | 01 | LFSR[28:27] | LFSR[26] | LFSR[29] |
| 1 | 10 | 10 | LFSR[29:28] | LFSR[27:26] | LFSR[30] |
| 1 | 10 | 11 | LFSR[30:29] | LFSR[28:26] | LFSR[31] |
| 1 | 11 | 00 | LFSR[28:26] | | LFSR[29] |
| 1 | 11 | 01 | LFSR[29:27] | LFSR[26] | LFSR[30] |
| 1 | 11 | 10 | LFSR[30:28] | LFSR[27:26] | LFSR[31] |
| 1 | 11 | 11 | LFSR[31:29] | LFSR[28:26] | LFSR[32] |

FIG 5

| #bits | taps 7 | 12 | 20 | 23 | 26 | 27 | 28 | 29 | 30 | 31 |
|---|---|---|---|---|---|---|---|---|---|---|
| 26 | X | X |   | X | X |   |   |   |   |   |
| 27 | X |   |   | X | X | X |   |   |   |   |
| 28 | X |   | X |   | X |   | X |   |   |   |
| 29 | X |   | X |   |   |   | X | X |   |   |
| 30 | X |   |   |   |   |   | X | X | X |   |
| 31 |   |   |   |   |   |   | X | X | X | X |
| 32 | X |   |   |   | X |   |   |   | X | X |

SEMI-CONDUCTOR COMPONENT TEST DEVICE WITH SHIFT REGISTER, AND SEMI-CONDUCTOR COMPONENT TEST PROCEDURE

CLAIM FOR PRIORITY

This application claims the benefit of priority to German Application No. 10 2004 051 344.9 which was filed in the German language on Oct. 21, 2004, the contents of which are hereby incorporated by reference.

TECHNICAL FIELD OF THE INVENTION

The invention relates to a semi-conductor component test device with shift register, as well as a semi-conductor component test procedure.

BACKGROUND OF THE INVENTION

Semi-conductor components, e.g. corresponding integrated (analog and/or digital) computer circuits, semi-conductor memory components such as for instance function memory components (PLAs, PALs, etc.) and table memory components (e.g. ROMs or RAMs, particularly SRAMs and DRAMs) etc. are subjected to numerous tests during the course of the manufacturing process.

For the simultaneous manufacture of numerous (generally identical) semi-conductor components, a so-called wafer (i.e. a thin disk consisting of monocrystalline silicon) is used. The wafer is appropriately processed (e.g. subjected to numerous coating, exposure, etching, diffusion and implantation process steps, etc.), and subsequently sawn up (or for instance scored and snapped off), so that the individual components become available.

During the manufacture of semi-conductor components (e.g. DRAMs (Dynamic Random-Access Memories and/or dynamic Read/Write memories), particularly DDR-DRAMs (Double data Rate—DRAMs and/or DRAMs with double data rate)) the components (still on the wafer and incomplete) may be subjected to corresponding test procedures at one or several test stations by means of one or several test apparatuses (e.g. so-called kerf measurements at the scoring grid) even before all the required above processing steps have been performed on the wafer (i.e. even while the semi-conductor components are still semi-complete).

After the semi-conductor components have been completed (i.e. after all the above wafer processing steps have been performed) the semi-conductor components are subjected to further test procedures at one or several (further) test stations—for instance the components—still present on the wafer and completed—may be tested with the help of corresponding (further) test apparatuses ("disk tests").

In corresponding fashion, several further tests may be performed (at further corresponding test stations and by using corresponding further test equipment) e.g. after the semi-conductor components have been installed in corresponding semi-conductor-component housings, and/or e.g. after the semi-conductor component housings (together with the semi-conductor components installed in them) have been installed in corresponding electronic modules (so-called "module tests").

While testing the semi-conductor components (e.g. during the above disk tests, module tests, etc.), test procedures such as for instance "DC tests" and/or "AC tests" can be applied.

During a DC test for instance a voltage (or current) at a specific—in particular a constant—level may be applied to corresponding connections of a semi-conductor component to be tested, whereafter the level of the—resulting—currents (and/or voltages) are measured—in particular tested to see whether these currents (and/or voltages) fall within predetermined required critical values.

During an AC test in contrast, voltages (or currents) at varying levels can for instance be applied to the corresponding connections of a semi-conductor component, particularly corresponding test sample signals, with the help of which appropriate function tests may be performed on the semi-conductor component in question.

With the aid of above test procedures, defective semi-conductor components and/or modules may be identified and then removed (or else also partially repaired), and/or the process parameters—applied during the manufacture of the components in each case—may be appropriately modified and/or optimized in accordance with the test results achieved, etc., etc.

In the case of numerous applications—e.g. in server or workstation computers, etc., etc.—memory modules with data buffer components (so-called buffers) connected in series before them, e.g. so-called "buffered DIMMs", may be used.

Memory modules of this nature generally contain one or more semi-conductor memory components, particularly DRAMs, as well as one or more data buffer components connected in series before the semi-conductor memory components (which may for instance be installed on the same printed circuit board as the DRAMs).

The memory modules are connected—particularly with a corresponding memory controller connected in series (e.g. arranged externally to the memory module in question)—with one or several micro-processors of a particular server or work station computer, etc.

In "partially" buffered memory modules, the address and control signals—e.g. emitted by the memory controller, or by the processor in question—may be (briefly) retained by corresponding data buffer components and then relayed—in chronologically co-ordinated, or where appropriate, in multiplexed or de-multiplexed fashion—to the memory components, e.g. DRAMs.

In contrast, the (useful) data signals—emitted by the memory controller and/or by each processor—may be directly—i.e. without being buffered by a corresponding data buffer component (buffer)—relayed to the memory component (and—conversely—the (useful) data signals emitted by the memory components may be directly—without a corresponding data buffer component (buffer) being connected in series before it—relayed to the memory controller and/or to the processor in question).

In "fully buffered" memory modules in contrast, the address and control signals, as well as the corresponding (useful) data signals exchanged between the memory controller and/or each processor and the memory components, can first be buffered by corresponding data buffer components before being relayed to the memory component and/or memory controller or to the processor in question.

If the above buffered memory module (or any other memory module) is subjected to a corresponding module test (for instance for testing the soldered connections and conductive tracks on the memory module, for instance the conductive tracks between the memory components/data buffer components), appropriate so-called MBIST devices (MBIST=Memory Built In Self Test) can be used, and corresponding LFSR devices (LFSR=Linear Feedback Shift Registers), for instance MBIST and LFSR devices provided on the date buffering components.

In order to perform an appropriate module test, corresponding pseudo-random test (useful) data signals—exhibiting a particular pre-set data width—can be accordingly tapped at the LFSR devices and relayed via corresponding data lines to the memory components, so that corresponding quasi-random test (useful) data is stored in the memory components.

The (test) address and (test) control signals required in order to perform the corresponding module tests can be generated by the above MBIST devices and relayed via corresponding address and control lines to the memory components.

The above procedure (in particular the use of pseudo-random test data signals generated by the LFSR devices) has the effect that test (useful) data signals—generated by the LFSR devices—and present on the data lines, exhibit a relatively wide spectrum of differing frequencies and/or that the test (useful) data signals consist of a relatively broad band of mixed frequencies.

Due to the pre-set fixed data width of the pseudo-random test (useful) data signals provided by LFSR devices, only memory components of a particular kind (namely memory components with a data width which corresponds with that of the pseudo-random test (useful) data signals provided by the LFSR devices) can be tested with these signals. If memory components with a data width which differs from this are to be tested, other LFSR devices with correspondingly different pseudo-random test (useful) data signal data widths must be used.

SUMMARY OF THE INVENTION

The invention is aimed at providing a novel semi-conductor component test device with shift register, in particular an LFSR (LFSR=Linear Feedback Shift Register), as well as a novel semi-conductor component test procedure.

It achieves these and further aims by means of the subject matters of claims 1 and 13.

Advantageous further developments of the invention are listed in the subsidiary claims.

In terms of one aspect of the invention, a semi-conductor component test device with a shift register is made available, comprising several memory devices from which pseudo-random values (BLA, COL, ROW) to be used for testing a semi-conductor component are able to be tapped and emitted at corresponding outputs of the semi-conductor component test device, whereby the shift register comprises at least one further memory device, from which a further pseudo-random value (VAR) is able to be tapped and whereby a device is provided, with which the further pseudo-random value (VAR) can selectively, if needed, be emitted at at least one corresponding further output of the semi-conductor component test device.

In this way it can be achieved that pseudo-random test signals with variably adjustable data and/or address widths can be made available.

BRIEF DESCRIPTION OF THE DRAWINGS

Below, the invention is more closely described with the use of an embodiment example and the attached illustration. In the illustration:

FIG. 4 shows a switch table in order to illustrate a possible functioning of one of the switch elements illustrated in FIG. 3; and FIG. 5 shows a switch table in order to illustrate a possible functioning of another one of the switch elements illustrated in FIG. 3.

DETAILED DESCRIPTION OF THE INVENTION

Figure 1:
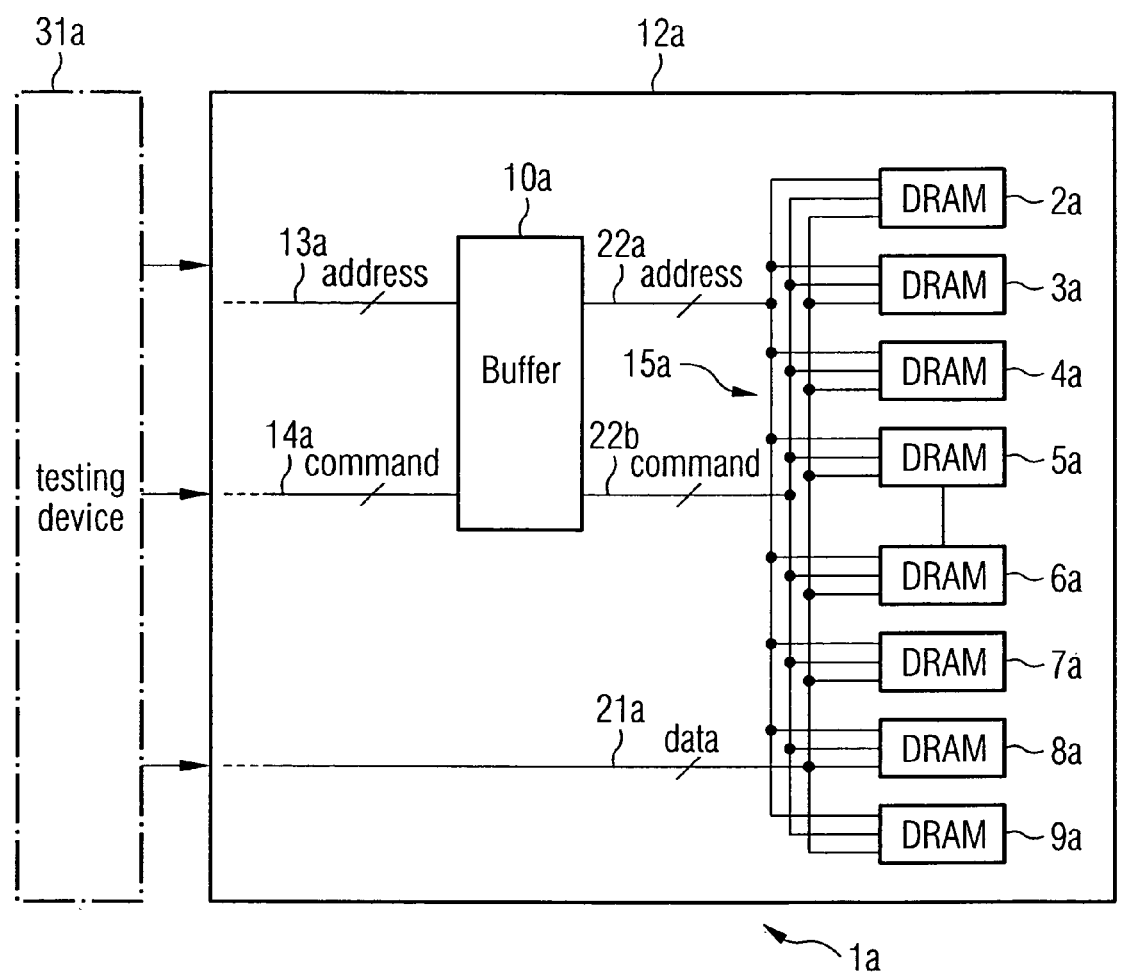
FIG. 1 shows a schematic representation of a partially buffered memory module, with corresponding memory components and corresponding data buffer components, with which a semi-conductor component test device in terms of an embodiment example of the present invention can be used.
Figure 3:
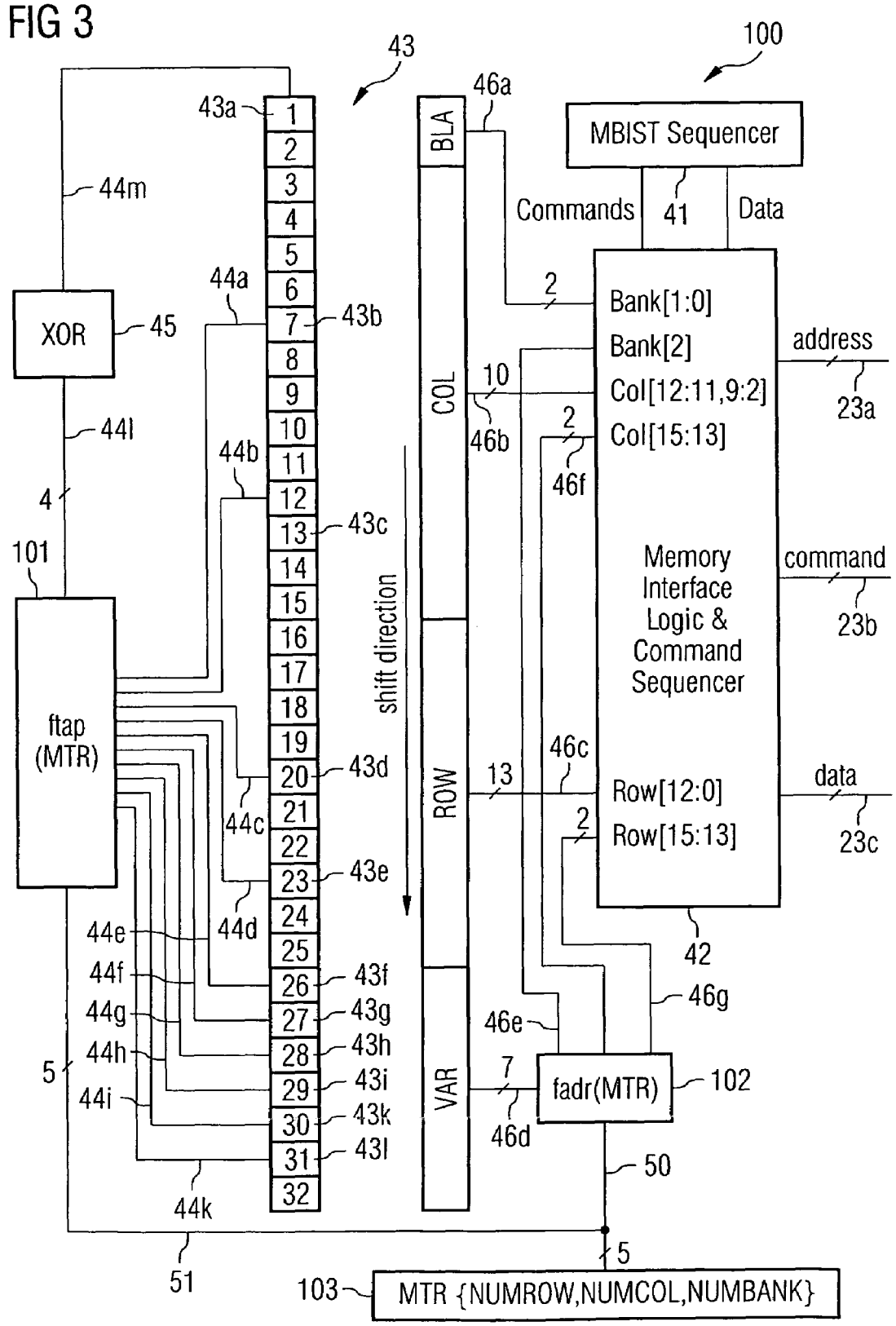
FIG. 3 shows a schematic detailed representation of a semi-conductor component test device with shift register device, in particular an LFSR device, able to be used in the memory module in terms of FIG. 2.

In FIG. 1 a schematic representation of a "partially" buffered memory module 1*a* (here: a "buffered DIMM" 1*a*) is shown, in which a semi-conductor component test device, in particular an LFSR device (LFSR=Linear Feedback Shift Register, and/or linear, back-connected shift register) in terms of an embodiment example of the present invention can be used, in particular the test and/or LFSR devices 100, 43 shown in FIG. 3 (and/or correspondingly similar devices).

As is more closely described below, a special semi-conductor test procedure—variable in terms of the respective address width used in each case—can be performed for the memory module 1*a* with the aid of the semi-conductor component test device 100, in particular the LFSR device 43 (and/or correspondingly similar devices).

Alternatively the LFSR device 43 or a correspondingly similar device (and/or the semi-conductor component test device 100 or a correspondingly similar device) can be used for testing a plurality of further systems—differing from the systems shown in FIG. 1 (and FIG. 2)—in particular for any other test procedure corresponding with the above semi-conductor test procedure and/or correspondingly similar semi-conductor test procedures, in which the address and/or data widths used in each case should be variably selectable.

The corresponding LFSR device 43 or the correspondingly similar device (and/or the semi-conductor component test device 100 or the correspondingly similar device) can then be provided—as is more closely described below—instead of on a buffer, for instance also on any suitable—external—test apparatus (e.g. on the test apparatus 31*a* mentioned below or any other suitable—external—test apparatus) and/or on the memory component 2*a* to be tested—more closely described below—itself (or on any other semi-conductor component, particular a memory component) etc.

As is apparent from FIG. 1, the memory module 1*a* shown there contains a plurality of memory components 2*a*, 3*a*, 4*a*, 5*a*, 6*a*, 7*a*, 8*a*, 9*a*, and—connected in series before the memory components 2*a*, 3*a*, 4*a*, 5*a*, 6*a*, 7*a*, 8*a*, 9*a*—one or several data buffering components ("buffers") 10*a*.

The memory components 2*a*, 3*a*, 4*a*, 5*a*, 6*a*, 7*a*, 8*a*, 9*a* may for instance be function storage or table memory components (e.g. ROMs or RAMs), particularly DRAMs.

As is apparent from FIG. 1, the memory components 2*a*, 3*a*, 4*a*, 5*a*, 6*a*, 7*a*, 8*a*, 9*a* may be arranged on the same printed circuit board 12*a* as the buffer 10*a*.

The memory module 1*a* can be connected—particularly with an appropriate memory controller connected in series before it (e.g. one installed externally to the memory module 1*a*, in particular one installed externally to the above card 12*a* and not shown here)—with one or several micro-processors, particularly with one or several micro-processors of a server or workstation computer (or any other suitable micro-processor, e.g. of a PC, laptop, etc.).

As is apparent from FIG. 1, in the partially buffered memory module 1a shown there, the address—and control—signals, for instance emitted by the memory controller or by the processor in question, are not directly relayed to the memory components 2a, 3a, 4a, 5a, 6a, 7a, 8a, 9a.

Instead of this, the address signals—for instance via a corresponding address bus 13a(and/or corresponding address lines)—, and the control signals—for instance via a corresponding control bus 14a(and/or corresponding control lines)—are first led to the buffers 10a.

The control signals may be any suitable control signals as used in conventional memory modules, e.g. corresponding read and/or write, and/or chip-select (memory component selection) signals, etc., etc.

In the buffers 10a the corresponding signals (address signals, control signals) are—briefly—buffered, and relayed—in a chronologically co-ordinated, or where needed, in multiplexed or demultiplexed fashion—to the memory components 2a, 3a, 4a, 5a, 6a, 7a, 8a, 9a via address lines 22a and command lines 22b to a corresponding central memory bus 15a.

With the partially buffered memory module 1a shown in FIG. 1 on the other hand, the (useful) data signals—e.g. those emitted by the above memory controller or by the relevant processor—can be relayed directly—without buffering by a corresponding data buffer component (buffer)—to the memory components 2a, 3a, 3a, 4a, 5a, 6a, 7a, 8a, 9a, (e.g. via a (useful) data bus 21a, which is directly connected with the above central memory bus 15a (and/or corresponding (useful) data lines).

Correspondingly inverted, the (useful) data signals—emitted by the memory components 2a, 3a, 4a, 5a, 6a, 7a, 8a, 9a—may also be relayed directly—without the inter-connection of a corresponding data buffering component (buffer)—to the memory controller and/or to the relevant processor (e.g. again via the above (useful) data bus 21a, which is directly connected with the central memory bus 15a).

Figure 2:
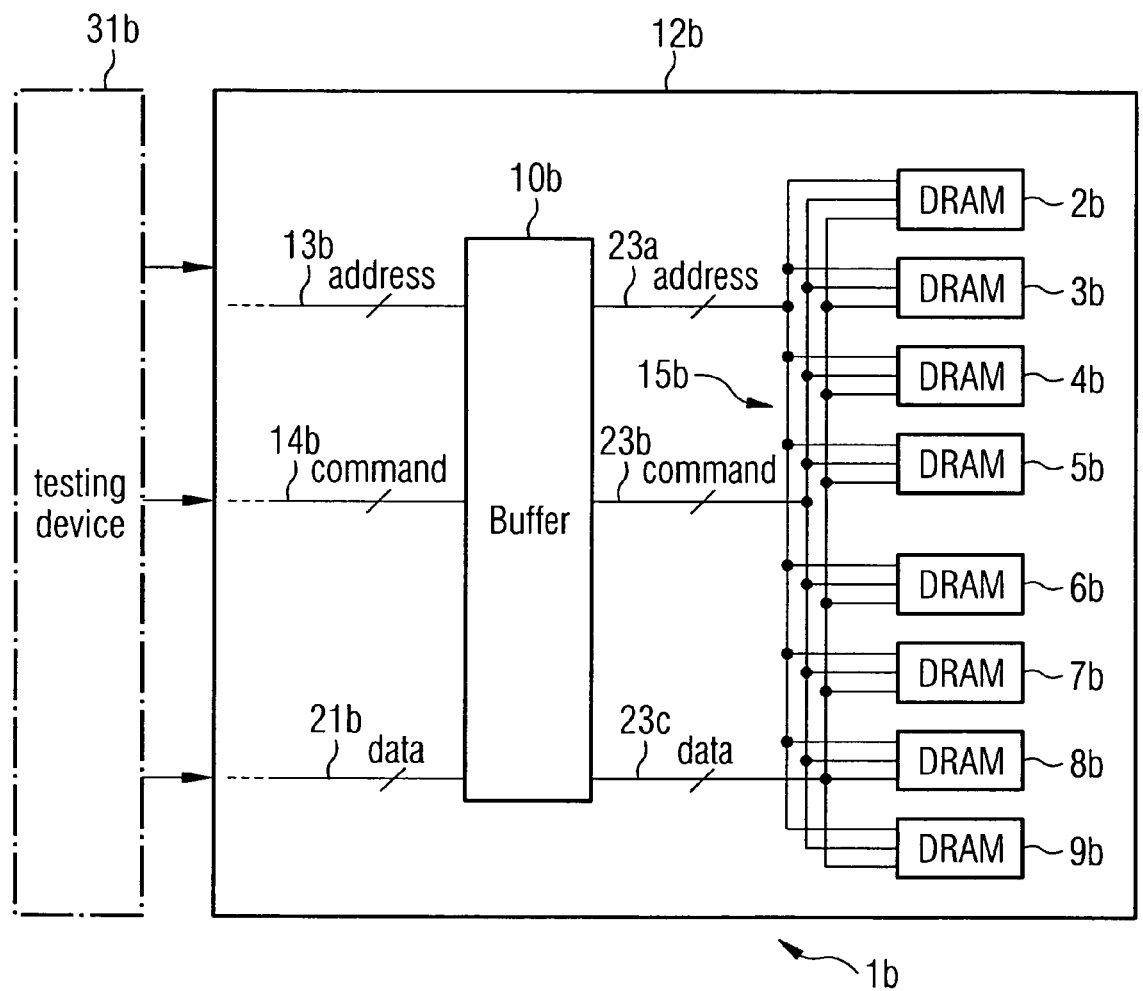
FIG. 2 shows a schematic representation of a fully buffered memory module, with corresponding memory components and corresponding data buffer components, with which—also—a semi-conductor component test device in terms of an embodiment example of the present invention can be used.

In FIG. 2 a schematic representation of a fully buffered memory module 1b (here: a "buffered DIMM" 1b) is shown, in which—in the same way—a semi-conductor component test device (and/or a correspondingly similar device), in particular a LFSR device (LFSR =Linear Feedback Shift Register, and/or linear back-connected shift register) in terms of an embodiment example of the present invention can be used, in particular the test and/or LFSR devices 100, 43 shown in FIG. 3 (and/or correspondingly similar devices).

As is more closely described below—correspondingly similar to the memory module 1a—the above special semi-conductor component test procedure (and/or a correspondingly similar test procedure more closely described below)—variable with regard to the address width used in each case—can—with the aid of the semi-conductor component test device 100, in particular the LFSR device 43 (and/or correspondingly similar devices)—also be performed for the memory module 1b shown in FIG. 2.

As is apparent from FIG. 2, the memory module 1b shown there—corresponding with the partially buffered memory module 1a as in FIG. 1—exhibits a plurality of memory components 2b, 3b, 4b, 5b, 6b, 7b, 8b, 9b, and—connected in series in front of the memory components 2b, 3b, 4b, 5b, 6b, 7b, 8b, 9b—one or more data buffer components ("buffers") 10b.

As is apparent from FIG. 2, the memory components 2b, 3b, 4b, 5b, 6b, 7b, 8b, 9b can be arranged on the same printed circuit board 12b as the buffers 10b.

The memory module 1b can be connected (correspondingly similar to the memory module 1a shown in FIG. 1a)—in particular with a corresponding memory controller (not shown here and e.g. arranged externally to the memory module 1b, in particular arranged externally to the above printed circuit board 12b) connected in series in front of it—with one or several micro-processors, particularly with one or several micro-processors of a server or workstation computer (or any other suitable micro-processor, e.g. of a PC, laptop, etc.).

As is apparent from FIG. 1 and 2, the memory module 1b shown in FIG. 2 is correspondingly similarly and/or identically constructed, and operates similarly or identically to the memory module 1a shown in FIG. 1, except that with the buffer 10b—correspondingly similar to conventional fully buffered memory modules—the (useful) data signals on line 21b exchanged between the memory controller and/or the respective processor and the memory components 2b, 3b, 4b, 5b, 6b, 7b, 8b, 9b are (in addition to the address and control signals provided on lines 13b and 14b respectively buffered similarly as in the memory module 12a shown in FIG. 1) also buffered.

In the buffer 10b the corresponding data signals, e.g. those deriving from the memory controller and/or the respective processor, for instance relayed via a data bus 21b, can be—briefly—buffered and relayed in a chronologically coordinated, or where appropriate, in a multiplexed or de-multiplexed fashion, to the memory components 2b, 3b, 4b, 5b, 6b, 7b, 8b, 9b (e.g. via a—central—memory bus 15b (with corresponding control, address and data lines 23a, 23b, 23c) which corresponds with the above central bus 15a described in relation to FIG. 1)).

Correspondingly inverted, the data signals emitted by the memory components 2b, 3b, 4b, 5b, 6b, 7b, 8b, 9b, for instance to the central memory bus 15b, can also be—briefly—buffered in the buffer 10b and relayed—in a chronologically co-ordinated and, where needed, in a multiplexed or de-multiplexed fashion—to the memory controller and/or to the respective processor, for instance via the above data bus 21b.

FIG. 3 shows—as an example—a schematic detail representation of a section of a data buffering component and/or buffer 10b used in memory module 1b in terms of FIG. 2 (and in a correspondingly similar embodiment, also able to be used in the memory module 1a shown in FIG. 1), in particular of the semi-conductor component test device 100 with LFSR device 43 provided there, with which—as is more closely described below—the special semi-conductor test procedure already briefly mentioned above, variable in relation to the address width used in each case, can be performed.

As is apparent from FIG. 3, the semi-conductor component test device 100—correspondingly similar to conventional data buffering components—contains an MBIST device 41 (MBIST=Memory Built In Self Test) and a memory interface logic device 42.

The memory interface logic device 42 can also be connected with the above memory bus 15b (in particular with the above address, control and data lines 23a, 23b, 23c) and can therefore—for test purposes—apply corresponding address, control and (useful) data signals to the memory components 2b, 3b, 4b, 5b, 6b, 7b, 8b, 9b.

If corresponding pseudo-random test (useful) data signals are to be used as test (useful) data signals, an LFSR (LFSR=Linear Feedback Shift Register, not shown here) can—corresponding with conventional data buffering components—be provided in the MBIST device 41. The pseudo-random test (useful) data signals generated by the LFSR can be relayed—via the above data lines 23c, and with memory interface logic device 42 connected in series before it—to the memory components 2b, 3b, 4b, 5b, 6b, 7b, 8b, 9b and be stored there as corresponding quasi-random test (useful) data.

This has the advantage that, during the execution of a corresponding module test, a relatively large number of differing frequency components occurs in the test (useful) data signals present on the corresponding data lines 23c and/or that the test (useful) data signals consist of a relatively broad-band mixture of frequencies.

In the present embodiment example—as is more closely described below—during the execution of a corresponding module test, an identical and/or similar effect can (alternatively or additionally) inter alia also be achieved for the test address signals relayed via the above address lines 23a (also with the memory interface logic device 42 connected in series before it) to the memory components 2b, 3b, 4b, 5b, 6b, 7b, 8b, 9b:

For this, the LFSR device 43 (LFSR=Linear Feedback Shift Register)—already mentioned above—is used, which—as is more closely described below—generates appropriate quasi-random address data and/or pseudo-random address data.

As is apparent from FIG. 3, the LFSR device 43 contains several series-connected memory devices 43a, 43b, 43c, 43d, 43e, 43f, 43g, 43g, 43h, 43i, 43k, 43l creating a memory device chain (e.g. more than ten or twenty, here e.g. 32 series-connected memory devices), in which a corresponding binary number ("logic one", or "logic zero") can be stored.

A memory device 43b (here e.g.: the seventh memory device 43b) of the memory devices 43a, 43b, 43c, 43d, 43e, 43f, 43g, 43g, 43h, 43i, 43k, 43l—lying in the above memory device chain e.g. behind the first, second and third memory device 43a—is connected via a feedback line 44a ("tap") with a first input of a switch element 101, and a memory device 43c of the memory devices 43a, 43b, 43c, 43d, 43e, 43f, 43g, 43g, 43h, 43i, 43k, 43l—which lies even further "back" in the above memory device chain in relation to the memory device 43b—(here e.g.: the twelfth memory device 43c) via a feedback line 44b ("tap") with a second input of the switch element 101.

In correspondingly similar fashion several further memory devices 43d, 43e, 43f, 43g, 43h, 43i, 43k, 43l of the memory devices 43a, 43b, 43c, 43d, 43e, 43f, 43g, 43h, 43i, 43k, 43l—lying even further "back" in the above memory device chain in relation to the memory devices 43a, 43b—are connected via corresponding further feedback lines 44c, 44d, 44e, 44f, 44g, 44h, 44i, 44k ("taps") with corresponding further inputs of the switch elements 101.

As is more closely described below, signals—correspondingly selected by the switch element 101—present on four different lines of the above feedback lines 44a, 44b, 44c, 44d, 44e, 44f, 44g, 44h, 44i, 44k, are in each case relayed with the aid of the switch elements 101 to four different lines 44l connected with an XOR element (Exclusive OR element) 45, and thereby to four corresponding inputs of the XOR element 45.

With the LFSR device 43, correspondingly similar to conventional LFSRs, at each step the binary number stored in one particular memory device of the series-connected memory devices 43a, 43b, 43c, 43d, 43e, 43f, 43g, 43h, 43i, 43k, 43l is in each case written into the next, adjacent memory device lying one step further "back" in the memory device chain, and the binary number emitted by the XOR element 45 via a line 44m, is written into the (first) memory device 43a.

A first pseudo-random value ("BLA") can thereby be tapped at several lines 46a connected with a first group of memory devices (here: the first two memory devices 43a), and a further pseudo-random value ("COL") at lines 46b, connected with a second group of memory devices (here: the third to fifteenth memory device 43b, 43c), a third pseudo-random value ("ROW") at lines 46c connected with a third group of memory devices (here: the sixteenth to twenty-fifth memory device 43d, 43e) and a fourth pseudo-random value ("VAR") at lines 46d connected with a fourth group of memory devices (here: the twenty-sixth to thirty-second memory device 43f, 43g, 43h, 43i, 43k, 43l).

The pseudo-random value BLA that can be tapped at lines 46a can have a width which corresponds with the (minimum) bank address width of the memory components to be tested by the LFSR device 43 (e.g. the bank address width of the memory components 2b, 3b, 4b, 5b, 6b, 7b, 8b, 9b).

In correspondingly similar fashion the pseudo-random value COL, capable of being tapped at lines 46b, can have a width corresponding with the (minimum) column address width of the memory components to be tested with the LFSR device (e.g. the column address width of the memory components 2b, 3b, 4b, 5b, 6b, 7b, 8b, 9b), and the pseudo-random value ROW able to be tapped at 46c, a width corresponding with the (minimum) row address width of the memory components to be tested with the LFSR device 43 (e.g. the row address width of the memory components 2b, 3b, 4b, 5b, 6b, 7b, 8b, 9b).

The pseudo-random value VAR that can be tapped at lines 46d can have a width corresponding with the number of alternatively additionally variably addressable address lines (bank and/or column and/or row address lines)(so that—as is more closely described below—memory components having a higher bank and/or column and/or row address width than the memory components 2b, 3b, 4b, 5b, 6b, 7b, 8b, 9b can also be tested by the LFSR device 43).

The pseudo-random value BLA that can be tapped at the lines 46a can—as is more closely described below—be used for addressing corresponding bank address lines of the above address lines 23a of the memory bus 15b (here: for addressing the bank address Bank[1:0]).

The pseudo-random value COL that can be tapped at lines 46b can—as is more closely described below—accordingly be used for addressing corresponding column address lines of the above address lines 23a of the memory bus 15b (here: for addressing the column address Col[12:11,9:2]).

In similar fashion—as is more closely described below—the pseudo-random value ROW capable of being tapped at lines 46c can be used for addressing corresponding row address lines of the above address lines 23a of the memory bus 15b (here: for addressing the row address Row[12:0]).

The pseudo-random value VAR capable of being tapped at lines 46d—or any sections of it—can, as is more closely described below, be applied variably for addressing one or several additional bank address lines, and/or column address lines, and/or row address lines (here: for addressing one or several additional bank address lines (e.g. one or several of the bank address lines Bank[2]), and/or one or several additional column address lines (e.g. one or several of the column address lines Col[15:13]), and/or one or several additional row address lines (e.g. one or several of the row address lines Row[15:13]), etc.).

As is further apparent from FIG. 3, the test device 100 contains a further switch element 102, of which the inputs are connected via the above lines 46d with the above twenty-sixth to thirty-second memory device 43f, 43g, 43h, 43i, 43k, 43l (at which, as described above, the above pseudo-random value VAR can be tapped).

As is more closely described below, and is further apparent from FIG. 3, one or more signals present on lines 46d (connected with the twenty-sixth to thirty-second memory device 43f, 43g, 43h, 43i, 43k, 43l) can—selectively and variably—be relayed to one or several corresponding lines 46e with the aid of the further switch element 102, and/or to one or several corresponding lines 46f, and/or one or several corresponding lines 46g (and can thereby be used for addressing one or several of the above additional bank address lines (Bank[2]), and/or one or several of the above additional column address lines (Col[15:13]), and/or one or several of the above additional row address lines (Row[15:13]) etc.).

The use of (test) address signals generated by the LFSR device 43 (and applied to corresponding bank address lines, and/or column address lines, and/or row address lines of the above address lines 23a (and if needs be, to one or several selectively variably provided additional address lines) has the advantage that during the execution of a corresponding module test (triggered and/or centrally controlled by an external test apparatus 31a, 31b (e.g. a corresponding ATE tester (ATE=Automated Test Equipment)—more closely described below—which correspondingly controls the data buffering component 10b, in particular e.g. the test device 100 and/or a control register 103 provided there) a relatively large number of differing frequency segments occur in the test address signals present on the corresponding address lines 23a, and/or that the corresponding test address signals consist of a relatively broad-band frequency mixture.

Corresponding with conventional data buffering components/conventional built-in test devices, it is also ensured by means of the MBIST device 41, and/or the memory interface logic device 42, that with the data buffering component 10b and/or the built-in test device 100 the address signals (corresponding with the signals present on lines 46a, 46b, 46c (or if needs be, additionally on the lines 46e, 46f, 46g)) emitted to the address lines 23a—and/or additionally to one or several further address lines—are emitted in correct chronological co-ordination, together with and/or before/after corresponding test (useful) data signals and test control signals emitted to the data lines 23c and the control lines 23b (controlled by the MBIST device 41, and/or the memory interface logic device 42):

For instance, first, with the aid of a word line activation command (activate command (ACT)) emitted to the control lines 23b, a corresponding word line—defined by the above row address (or where appropriate, by the pseudo-random (test) row address) emitted to the address lines 23a—of a corresponding sub-array ("bank") of a corresponding memory component 2b, 3b, 4b, 5b, 6b, 7b, 8b, 9b—defined by the above bank address (or as the case may be, by the pseudo-random (test) bank address) emitted to the above address lines 23a—is activated.

Then—with the aid of a corresponding read or write command (read (RD) and/or write (WT) command) emitted to the control lines 23b—the effect is achieved that the corresponding data—now exactly specified by the above column address (or as the case may be, the pseudo-random (test) column address) emitted to the address lines 23a—is emitted by the corresponding memory component 2b, 3b, 4b, 5b, 6b, 7b, 8b, 9b (or read into it).

The word line in question is at first left in an activated state.

If the word line, which has already been activated, is then again accessed at the corresponding sub-array ("bank"), the output of a further word line activation command (ACT command) may be dispensed with (Case A).

Instead of this, a corresponding read (or write) command (RD (or WT) command can immediately be emitted to the control lines 23b (and a (new) column address (or where appropriate, a pseudo-random (test) column address) precisely specifying the respective data can be emitted to the address lines 23a).

Only then, when a word line, which differs from the word line activated last, is next accessed at the corresponding sub-array ("memory bank"), the corresponding word line—last used—is deactivated by means a corresponding word line deactivation command (PRE command), emitted to the control lines 23b, whereupon the—new—word line is activated (by emitting a corresponding further word line activation command (ACT command) to the control lines 23b) (Case B)).

By means of the switch element 102, as already described above (and corresponding with a functional allocation fadr (MTR)(and/or more correctly: fadr(MTR{NUMROW, NUMCOL,NUMBANK}) delivered by the switch element 102), one or several of the signals present on lines 46d (connected with the above twenty-sixth to thirty-second memory device 43f, 43g, 43h, 43i, 43k, 43l) are—selectively and variably—relayed to one or several corresponding lines 46e and/or one or several corresponding lines 46f and/or one or several corresponding lines 46g (and thereby used to address one or several of the above additional bank address lines (Bank[2b]), and/or one or several of the above additional column address lines (Col[15:13]), and/or one or several of the above additional row address lines (Row[15:13])).

With the above function fadr(MTR{NUMROW,NUMCOL,NUMBANK}) the term NUMBANK in the embodiment example described here, in each case symbolizes the number of additional bank address bits (present at the memory component to be tested) required in addition to the pre-set (minimum) bank address width (here: 2 (Bank[1:0])) and variably adjustable by the test device 100 (whereby in the present embodiment example e.g. either NUMBANK=0 (binary: "0") additional bank address bits, or NUMBANK=1 (binary: "1") additional bank address bits can be selected (cf. also FIG. 4)).

In correspondingly similar fashion, in the above function fadr(MTR{NUMROW,NUMCOL,NUMBANK}), the term NUMROW in each case symbolizes the number of additional row address bits (present at the memory component to be tested) required in addition to the pre-set (minimum) row address width (here: 13 (Row[12:0]))—and variably adjustable at the test device 100 (whereby e.g. either NUMROW=0 (binary: "00") additional row address bits, or NUMROW=1 (binary: "01") additional row address bits, or NUMROW=2 (binary: "10") additional row address bits, or NUMROW=3 (binary: "11") additional row address bits can be selected in the present embodiment example (cf. also FIG. 4)).

With the present embodiment example, in the above function fadr(MTR{NUMROW,NUMCOL,NUMBANK}), the term NUMCOL in each case correspondingly symbolizes the number of additional column address bits (present at the memory component to be tested) required in addition to the pre-set (minimum) column address width (here: 10 (Col[12:11,9:2]))—and variably adjustable at the test device 100 (whereby e.g. either NUMCOL=0 (binary: "00") additional column address bits, or NUMCOL=1 (binary: "01") additional column address bits, or NUMCOL=2 (binary: "10") additional column address bits, or NUMCOL=3 (binary: "11") additional column address bits can be selected in the present embodiment example (cf. also FIG. 4)).

If the following should for instance apply: NUM-BANK="0", NUMROW="00", and NUMCOL="00"—as is apparent from the first row of the switch table shown in FIG. 4—the lines 46d connected with corresponding inputs of the switch element 102, are electrically and/or logically disconnected from the lines 46e, 46f, 46g connected with corresponding outputs of the switch element 102 by means of the switch element 102.

If however the following for instance should apply: NUMBANK="0", NUMROW="00", and NUMCOL="01",—as is apparent from the second row of the switch table shown in FIG. 4—that line of the lines 46d, which is connected with the twenty-sixth memory device 43f (LFSR[26]), is—by means of the switch element 102—electrically and/or logically connected with a first line of lines 46f, and the remaining lines of lines 46d electrically and/or logically disconnected from lines 46e, 46f, 46g.

Correspondingly, if the following for instance should apply: NUMBANK="0", NUMROW="00", and NUMCOL="10", that lines of the lines 46d, which are connected with the twenty-sixth and twenty-seventh memory device 43f, 43g (LFSR[27:26]) are—as is apparent from the third row of the switch table shown in FIG. 4—connected electrically and/or logically with the first and a second line of lines 46f, and the remaining lines of lines 46d are electrically and/or logically disconnected from lines 46e, 46f, 46g by means of the switch element 102.

In addition, in the case where the following for instance should apply: NUMBANK="0", NUMROW="00", and NUMCOL="11" those lines of the lines 46d—as is apparent from the fourth row of the switch table shown in FIG. 4—connected with the twenty-sixth, twenty-seventh and twenty-eighth memory device 43f, 43g, 43h (LFSR[28:26]), are electrically and/or logically connected with the first, second and a third line of lines 46f, and the remaining lines of the lines 46d are electrically and/or logically disconnected from lines 46e, 46g by means of the switch element 102.

In correspondingly similar fashion, in the case where for instance the following should apply: NUMBANK="0", NUMROW="01", and NUMCOL="00", then—as is apparent from the fifth row of the switch table shown in FIG. 4—that line of the lines 46d connected with the twenty-sixth memory device 43f (LFSR[26]) is connected electrically and/or logically with a first line of the lines 46g, and the remaining lines of lines 46d are electrically and/or logically disconnected from lines 46e, 46f, 46g by the switch element 102.

The corresponding further possibilities (with NUMBANK="0" or "1", NUMROW="00", "01", "10" or "11", and NUMCOL="00", "01", "10" or "11"), and the electrical and/or logical connections/disconnections arising from this between the lines 46d and the lines 46e, 46f, 46g—caused by the switch element 102—are similarly apparent from the switch table shown in FIG. 4.

The corresponding values for NUMBANK ("0" or "1"), NUMROW ("00", "01", "10" or "11"), and NUMCOL ("00", "0", "10" or "11") can be laid down in the corresponding memory devices of the control register 103 (e.g.—even after the manufacture and after the commissioning of test device 100—by means of the above external test apparatus 31a, 31b), and can—even after the manufacture and commissioning of the test device 100—be correspondingly variably changed (e.g. also by means of the external test apparatus 31a, 31b).

During the operation of the test device 100, the corresponding values selected in each case for NUMBANK ("0" or "1"), NUMROW ("00", "01", "10" or "11"), and NUMCOL ("00", "01", "10" or "11"), are read from the control register 103 and relayed via corresponding lines 50, 51 from the register 103 to the switch element 102 (and similarly to the switch element 101).

As already described above, by means of the switch element 101—selectively and variably—(and corresponding with a functional allocation ftap(MTR) and/or more accurately: ftap(MTR{NUMROW,NUMCOL,NUMBANK}) delivered by the switch element 101), one or several of the signals present at the above lines 44a, 44b, 44c, 44d, 44e, 44f, 44g, 44h, 44i, 44k (here: connected with the memory devices 43b, 43c, 43d, 43e, 43f, 43g, 43h, 43i, 43k, 43l, i.e. with the seventh, the twelfth, the twenty-third and the twenty-sixth to thirty-first memory device) are relayed to one or several of the above lines 44l.

As is apparent from the table illustrated in FIG. 5, the setting of the switch elements 101 can be selected depending on the total address width (#bits) deriving from the values for NUMBANK ("0" or "1"), NUMROW ("00", "0", "10" or "11"), and NUMCOL ("00", "01", "10" or "11") (illustrated in FIG. 5 by means of the example of a—variable—total address width of between 27 and 32 bits (whereby the total address width derives from the above (minimum) address width (here: the above (minimum) bank address width, plus the above (minimum) column address width, plus the above (minimum) row address width), and the number of additional address bits derived from the values for NUMBANK, NUMROW, and NUMCOL)).

As is for instance apparent from the first row of the switch table shown in FIG. 5, the lines 44a, 44b, 44d, 44e connected with the seventh, twelfth, twenty-third and twenty-sixth memory device 43b, 43c, 43e, 43f, can, at for instance a total address width (#bits) of 26, be connected electrically and/or logically with the four lines 44l connected with the XOR element 45 (and the lines connected with the remaining memory device disconnected from the four lines 44l) by means of the switch element 101.

In correspondingly similar fashion, as is for instance apparent from the second row of the switch table shown in FIG. 5, the lines 44a, 44d, 44e, 44f connected with the seventh, twenty-third, twenty-sixth and twenty-seventh memory device 43b, 43e, 43f, 43g can, at a total address width (#bits) of 27, for instance be electrically and/or logically connected with the four lines 44l connected with the XOR element 45 (and the lines connected with the remaining memory device disconnected from the four lines 44l) by means of the switch element 101.

Furthermore, as is for instance apparent from the third row of the switch table shown in FIG. 5, the lines 44a, 44c, 44e, 44g connected with the seventh, twentieth, twenty-sixth and twenty-eighth memory device 43b, 43d, 43f, 43h can, at a total address width (#bits) of 28, be electrically and/or logically connected with the four lines 44l connected with the XOR element 45 (and the lines connected with the remaining memory device disconnected from the four lines 44l) by means of the switch element 101.

The corresponding further possibilities, and the electrical and/or logic connections/disconnections—generated by the switch element 101—between the lines 44l, and the feedback lines 44a, 44b, 44c, 44d, 44e, 44f, 44g, 44h, 44i, 44k ("taps") deriving from them, are also to be seen in the switch table illustrated in FIG. 5.

By means of the above setting of the switch element 101—given as an example—(and illustrated in FIG. 5) it can be ensured that the random number sequence generated by the LFSR device 43 exhibits a periodicity, which corresponds with the number of actually used (address) bits (selected variably in accordance with the total address bandwidth required in each case). In this way it can be achieved that each address—within a Cycle—is only used once, i.e. that each memory cell selected by the corresponding address is only read and/or written once per cycle (and/or that a particular address exhibiting a specific pre-set address width generated by the LFSR device 43 is only generated—anew—by the LFSR device 43 when all other addresses—possible for the particular total address width in question—have previously been generated.)

Instead of a single LFSR device 43, several (e.g. three) separate, different LFSR devices can be used as an alternative.

A first LFSR device can for instance generate a pseudo-random value BLA' for controlling bank address lines, which value corresponds with the above pseudo-random value BLA, and a first optional additional pseudo-random value (VAR1) variably used for controlling one or several additional bank address lines.

Correspondingly a second LFSR device can for instance generate a pseudo-random value COL' corresponding with the above pseudo-random value COL, for controlling column address lines, and a second optional additional pseudo-random value (VAR2) variably used for controlling one or several additional column address lines.

In addition a third LFSR device can for instance generate a pseudo-random value ROW' corresponding with the above pseudo-random value ROW, for controlling row address lines, and a third optional additional pseudo-random value (VAR3) variably used for controlling one or several additional row address lines.

| Reference numbers | |
|---|---|
| 1a | Memory module |
| 1b | Memory module |
| 2a | Memory component |
| 2b | Memory component |
| 3a | Memory component |
| 3b | Memory component |
| 4a | Memory component |
| 4b | Memory component |
| 5a | Memory component |
| 5b | Memory component |
| 6a | Memory component |
| 6b | Memory component |
| 7a | Memory component |
| 7b | Memory component |
| 8a | Memory component |
| 8b | Memory component |
| 9a | Memory component |
| 9b | Memory component |
| 10a | Buffer |
| 10b | Buffer |
| 12a | Printed circuit board |
| 12b | Printed circuit board |
| 13a | Address bus |
| 13b | Address bus |
| 14a | Control bus |
| 14b | Control bus |
| 15a | Memory bus |
| 15b | Memory bus |
| 21a | Data bus |
| 21b | Data bus |
| 22a | Address lines |
| 22b | Control lines |
| 23a | Address lines |
| 23b | Control lines |
| 23c | Data lines |
| 31a | Test apparatus |
| 31b | Test apparatus |
| 41 | MBIST device |
| 42 | Memory interface logic device |

| -continued | |
|---|---|
| Reference numbers | |
| 43 | LFSR device |
| 43a | Memory device |
| 43b | Memory device |
| 43c | Memory device |
| 43d | Memory device |
| 43e | Memory device |
| 43f | Memory device |
| 43g | Memory device |
| 43h | Memory device |
| 43i | Memory device |
| 43k | Memory device |
| 43l | Memory device |
| 44a | Line |
| 44b | Line |
| 44c | Line |
| 44d | Line |
| 44e | Line |
| 44f | Line |
| 44g | Line |
| 44h | Line |
| 44i | Line |
| 44k | Line |
| 44l | Lines |
| 44m | Line |
| 45 | XOR-Glied |
| 46a | Lines |
| 46b | Lines |
| 46c | Lines |
| 46d | Lines |
| 46e | Lines |
| 46f | Lines |
| 46g | Lines |
| 50 | Lines |
| 51 | Lines |
| 100 | Test device |
| 101 | Switch member |
| 102 | Switch member |

What is claimed is:

1. A semi-conductor component test device with a shift register, several memory devices from which pseudo-random values representative of a minimum number of values of at least one of the group of a Bank address, a Row address, and a Column address to be used for testing a semi-conductor component are able to be tapped and emitted at corresponding outputs of the semi-conductor component test device, said minimum number of values of said at least one of said group being short of a required number of values, and whereby the shift register comprises a plurality of further memory devices, from which a like plurality of further pseudo-random values are able to be tapped and whereby a device is provided, from which the further pseudo-random values are emitted at at least one corresponding further output of the semi-conductor component test device to complete the required number of values for any, some or all of the Bank address, the Row address, and the Column address, wherein said minimum number of values is less than the required number of values.

2. The semi-conductor component test device according to claim 1, in which the shift register is a feedback shift register, in particular a linear feedback shift register.

3. The semi-conductor component test device according to claim 1, in which another pseudo-random value is applied to data inputs of the semi-conductor component to be tested.

4. The semi-conductor component test device according to claim 1, whereby the shift register comprises up to four further memory devices generating corresponding pseudo-random values.

5. The semi-conductor component test device according to claim 4, whereby the further pseudo-random values generated by the plurality of further memory devices are emitted at corresponding further outputs of the semi-conductor component test device.

6. The semi-conductor component test device according to claim 1, wherein the semiconductor component test device is provided on said semi-conductor component.

7. The semi-conductor component test device according to claim 6, further comprising a data buffering component.

8. The semi-conductor component test device according to claim 1, being manufactured as part of an external test apparatus.

9. A semi-conductor component test device with a shift register comprising:
    a plurality of memory devices from which a group of pseudo-random values used for addressing a semi-conductor component is tapped and emitted at corresponding outputs of the semi-conductor component test device, and wherein addressing said semi-conductor component requires at least one value greater than the number of values in said group;
    the shift register comprising at least one further memory device from which at least one further pseudo-random value is tapped;
    a device from which the further pseudo-random value is selectively emitted at at least one corresponding further output of the semi-conductor component test device; and
    said further pseudo-random value comprising at least one further address value applied to an address input of the semi-conductor component to be tested to complete said required number of values.

10. The semi-conductor component test device according to claim 9, in which the pseudo-random address values comprise pseudo-random Column address values.

11. The semi-conductor component test device according to claim 9, in which the pseudo-random address values comprise pseudo-random memory Bank address values.

12. The semi-conductor component test device according to claim 9, in which the pseudo-random address values comprise pseudo-random Row address values.

13. A semi-conductor component test procedure, whereby the procedure comprises the steps of:
    generating at least a pseudo-random address value and using the pseudo-random address value testing addressing a semi-conductor component to be tested;
    generating at least one further pseudo-random value;
    using the at least one further pseudo-random value to complete an address width of the semi-conductor component to be tested; and
    testing said semi-conductor component.

14. The test procedure according to claim 13, whereby successively generated pseudo-random values and further pseudo-random values exhibit a periodicity selected in accordance with the address width of the semi-conductor component to be tested.

15. The test procedure according to claim 14, whereby in one period all different pseudo-random address values that are maximally possible in terms of the respective data and address width are generated.

16. A semi-conductor component test device with a feedback shift register, which comprises several memory devices from which pseudo-random values to be used for addressing a semi-conductor component are able to be tapped and emitted at corresponding outputs of the semi-conductor component test device, whereby the feedback shift register comprises at least one further memory device, from which a further pseudo-random value is emitted at at least one corresponding further output of the semi-conductor component test device to complete a required number of values for at least one of a Bank address, a Row address, and a Column address, the test device additionally comprising a switching device adapted to feed back to the feedback shift register pseudo-random values from different ones of the memory devices depending on an address width of a semi-conductor component to be tested.

* * * * *

UNITED STATES PATENT AND TRADEMARK OFFICE
CERTIFICATE OF CORRECTION

PATENT NO.        : 7,415,649 B2                                        Page 1 of 1
APPLICATION NO.   : 11/253813
DATED             : August 19, 2008
INVENTOR(S)       : Bucksch It is certified that error appears in the above-identified patent and that said Letters Patent is hereby corrected as shown below:

In Col. 12, line 18, delete the second occurrence of "“0”" and insert --"01"--.
In Col. 16, line 7, claim 13, delete "testing" and insert --for--.

Signed and Sealed this

Twenty-first Day of October, 2008

JON W. DUDAS
*Director of the United States Patent and Trademark Office*